United States Patent
Paulose et al.

(10) Patent No.: US 12,362,760 B2
(45) Date of Patent: Jul. 15, 2025

(54) INDIRECT COMPARATOR OFFSET ESTIMATION

(71) Applicant: TEXAS INSTRUMENTS INCORPORATED, Dallas, TX (US)

(72) Inventors: Ajai Paulose, Bengaluru (IN); Aravind Ganesan, Bengaluru (IN)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 225 days.

(21) Appl. No.: 18/326,527

(22) Filed: May 31, 2023

(65) Prior Publication Data

US 2024/0250690 A1 Jul. 25, 2024

(30) Foreign Application Priority Data

Jan. 23, 2023 (IN) .............................. 202341004340

(51) Int. Cl.
*H03M 1/10* (2006.01)
*H03M 1/08* (2006.01)

(52) U.S. Cl.
CPC ......... *H03M 1/1023* (2013.01); *H03M 1/089* (2013.01)

(58) Field of Classification Search
CPC .......... H03M 1/08; H03M 1/10; H03M 1/089; H03M 1/1023
See application file for complete search history.

(56) References Cited

U.S. PATENT DOCUMENTS

| | | | | |
|---|---|---|---|---|
| 6,753,801 B2* | 6/2004 | Rossi | ...................... | H03F 3/005 |
| | | | | 341/172 |
| 7,839,922 B2* | 11/2010 | Chung | .............. | H04L 25/03146 |
| | | | | 375/232 |
| 8,526,551 B2* | 9/2013 | Flynn | ...................... | H04L 27/01 |
| | | | | 375/346 |
| 9,356,615 B1* | 5/2016 | Ranjbar | ................ | H03M 1/1023 |
| 9,385,695 B2* | 7/2016 | Chen | ................ | H04L 25/0296 |
| 9,397,693 B1* | 7/2016 | Jain | ........................ | H03M 1/125 |
| 9,674,009 B2* | 6/2017 | Dong | ........................ | H04B 1/16 |
| 11,277,144 B1* | 3/2022 | Cho | ........................ | H03K 5/003 |
| 11,581,860 B2* | 2/2023 | Kim | ...................... | H03F 3/45475 |
| 2003/0174790 A1* | 9/2003 | Ho | ...................... | H04L 27/2657 |
| | | | | 375/340 |
| 2005/0219090 A1* | 10/2005 | Jonsson | .............. | H03M 1/1061 |
| | | | | 341/120 |
| 2006/0217069 A1* | 9/2006 | Chen | ........................ | H04B 1/30 |
| | | | | 455/63.1 |
| 2008/0212715 A1* | 9/2008 | Chang | ................. | H04L 25/4919 |
| | | | | 375/317 |

(Continued)

*Primary Examiner* — Lam T Mai
(74) *Attorney, Agent, or Firm* — Mandy Barsilai Fernandez; Frank D. Cimino

(57) ABSTRACT

A system includes: a first device; and a second device coupled to the first device. The second device has a receiver. The receiver has a comparator and a controller. The comparator has an adjustment terminal. The controller has an input and an output. The output of the controller is coupled to the adjustment terminal of the comparator. The controller is configured to: obtain an offset estimation model; receive an input voltage at its input; determine a comparator offset responsive to the offset estimation model and the input voltage; and provide an adjustment control signal to its output responsive to the determined comparator offset.

20 Claims, 16 Drawing Sheets

(56) References Cited

U.S. PATENT DOCUMENTS

| | | | |
|---|---|---|---|
| 2010/0079327 A1* | 4/2010 | Berens | H03M 1/0682 |
| | | | 341/158 |
| 2011/0133971 A1* | 6/2011 | Ogawa | H03M 1/0678 |
| | | | 341/155 |
| 2014/0210656 A1* | 7/2014 | Choi | H03M 1/0863 |
| | | | 341/144 |
| 2017/0012634 A1* | 1/2017 | Ali | H03M 1/361 |
| 2019/0356326 A1* | 11/2019 | Liu | H03M 1/0607 |
| 2020/0007379 A1* | 1/2020 | Patil | H04L 27/06 |
| 2020/0054290 A1* | 2/2020 | Jang | A61B 5/1102 |
| 2021/0266200 A1* | 8/2021 | Yang | H04L 25/03885 |
| 2022/0224349 A1* | 7/2022 | Varshney | H03M 1/50 |

\* cited by examiner

INDIRECT COMPARATOR OFFSET ESTIMATION

CROSS-REFERENCE TO RELATED APPLICATION

The present application is related to: India Provisional Application No. 202341004340, titled "Indirect Offset Estimation Scheme", filed on Jan. 23, 2023, which is hereby incorporated by reference in its entirety.

BACKGROUND

Communication systems that rely on high-speed serial links can increase data rates using higher baud rates, higher order modulation schemes, or both. Example communication systems include 400G Ethernet networks and 5G base stations. Example high-speed serial links may have data rates of 56 Gbps. Example modulation schemes include pulse amplitude modulation 4-level (PAM4) or non-return-to-zero modulation (NRZ). At high-speed data rates, such as 56 Gbps or higher, communication system receivers often perform signal conditioning to account for channel effects such as signal loss and inter-symbol interference (ISI). Example signal conditioning includes clock and data recovery (CDR) operations. Use of modulation schemes, such as NRZ or PAM4, increases sensitivity to channel effects.

SUMMARY

In an example, a system includes: a first device; and a second device coupled to the first device. The second device has a receiver. The receiver has a comparator and a controller. The comparator has an adjustment terminal. The controller has an input and an output. The output of the controller is coupled to the adjustment terminal of the comparator. The controller is configured to: obtain an offset estimation model; receive an input voltage at its input; determine a comparator offset responsive to the offset estimation model and the input voltage; and provide an adjustment control signal to its output responsive to the determined comparator offset.

In another example, a receiver includes: a comparator having an adjustment terminal; and a calibrator having an input and an output. The output is coupled to the adjustment terminal. The calibrator is configured to: obtain an offset estimation model for the comparator; receive an input voltage at its input; determine a comparator offset responsive to the offset estimation model and the input voltage; and provide an adjustment control signal at its output responsive to the determined comparator offset.

In another example, a method includes: obtaining an offset estimation model for a comparator; receiving an input voltage; determining a comparator offset responsive to the offset estimation model and the input voltage; and providing the comparator offset to an adjustment terminal of the comparator.

DETAILED DESCRIPTION

Figure 1:
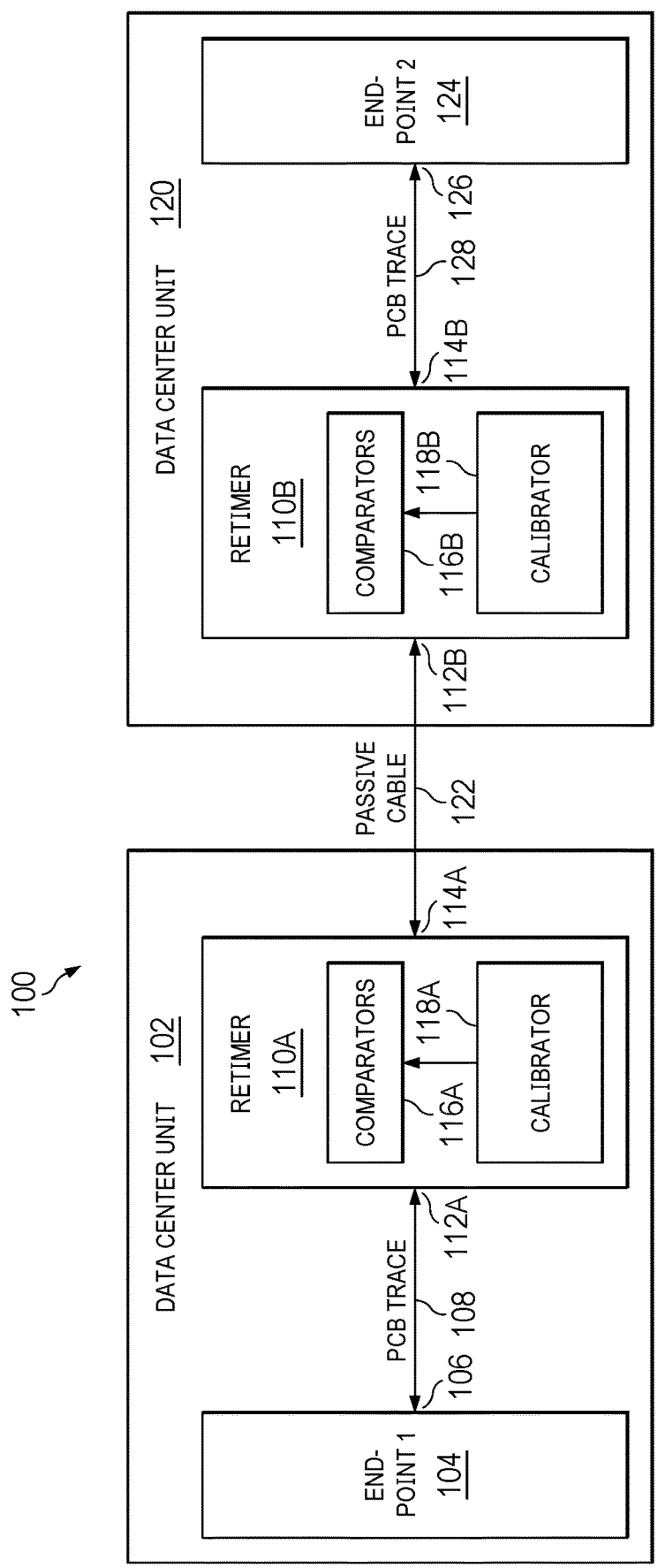
FIG. 1 is a diagram showing an example communication system 100 including comparators and related calibrators.

The same reference numbers or other reference designators are used in the drawings to designate the same or similar features. Such features may be the same or similar either by function and/or structure.

FIG. 1 is a diagram showing an example communication system 100 including comparators 116A, 116B and related calibrators 118A, 118B. As shown, the communication system 100 includes a first device 102 and a second device 120. In some examples, the first device 102 and the second device 120 may be data center units coupled via a cable 122. The first device 102 includes a first end-point 104 and a first retimer 110A. The first end-point 104 has a terminal 106. In some examples, the terminal 106 is a transmitter output terminal. The first retimer 110A has a first terminal 112A and a second terminal 114A. In some examples, the first terminal 112A is a receiver input terminal, and the second terminal 114A is a transmitter output terminal. In the example of FIG. 1, the terminal 106 of the first end-point 104 is coupled to the first terminal 112A of the first retimer 110A via a printed circuit board (PCB) trace 108 or other connector. Without limitation, the first end-point 104 may be a server or related components. As shown, the first retimer 110A includes comparators 116A and a calibrator 118A coupled to the comparators 116A.

The second device 120 includes a second end-point 124 and a second retimer 110B. The second end-point 124 has a terminal 126. In some examples, the terminal 126 is a receiver input terminal. The second retimer 110B has a first terminal 112B and a second terminal 114B. In some examples, the first terminal 112B is a receiver input terminal, and the second terminal 114B is a transmitter output terminal. In the example of FIG. 1, the terminal 126 of the second end-point 124 is coupled to the first terminal 112B of the second retimer 110B via a PCB trace 128 or other connector. Without limitation, the second end-point 124 may be a server or related components. As shown, the second retimer 110B includes comparators 116B and a calibrator 118B coupled to the comparators 116B.

In some examples, the first retimer 110A of the first device 102 operates to: receive data from the first end-point 104 at its first terminal 112A; and provide reconditioned data at its second terminal 114A responsive to the received data and signal conditioning operations of the first retimer 110A. The second retimer 110B of the second device 120 operates to: receive data from the first device 102 at its first terminal 112B; and provide reconditioned data at its second terminal 114B responsive to the received data and signal conditioning operations of the second retimer 110B. Example signal conditioning operation include continuous-time linear equalization (CTLE) operations, feedforward equalization (FFE) operations, data slicer operations, decision feedback equalization (DFE) operations and/or other operations. As part of such operations, the comparators 116A of the first retimer 110A may compare input data voltages to respective thresholds and provide comparison results. The accuracy of each of the comparators 116A and related operations is affected by an offset of each of the comparators 116A. The offset of each of the comparators 116A varies from other comparators and may change over time. In order to improve the accuracy of the comparators 116A and related operations, the calibrator 118A provides adjustment control signals to the comparators 116A. In some examples, the calibrator 118A determines the adjustment control signals based on indirect offset estimation for one or more of the comparators 116A. One example of indirect offset estimation, performed by the calibrator 118A, includes: obtaining an offset estimation model; receiving input voltages; estimating comparator offsets responsive to the offset estimation model and the input voltages; and providing adjustment control signals to the comparators 116A responsive to the estimated comparator offsets.

Similarly, the comparators 116B of the second retimer 110B may compare input data voltages to respective thresholds and provide comparison results. The accuracy of the comparators 116B and related operations is affected by an offset of each of the comparators 116B. The offset of each of the comparators 116B varies from other comparators and may change over time. In order to improve the accuracy of the comparator 116B and related operations, the calibrator 118B provides adjustment control signals to the comparators 116B. In some examples, the calibrator 118B determines the adjustment control signals based on indirect offset estimation. One example of indirect offset estimation, performed by the calibrator 118B, includes: obtaining an offset estimation model; receiving input voltages; estimating comparator offsets responsive to the offset estimation model and the input voltages; and providing adjustment control signals to the comparators 116B responsive to the estimated comparator offsets. In some examples, each of the calibrators 118A and 118B include a reference comparator, a controller, and/or other circuitry (see e.g., FIGS. 5 and 7).

Figure 2:
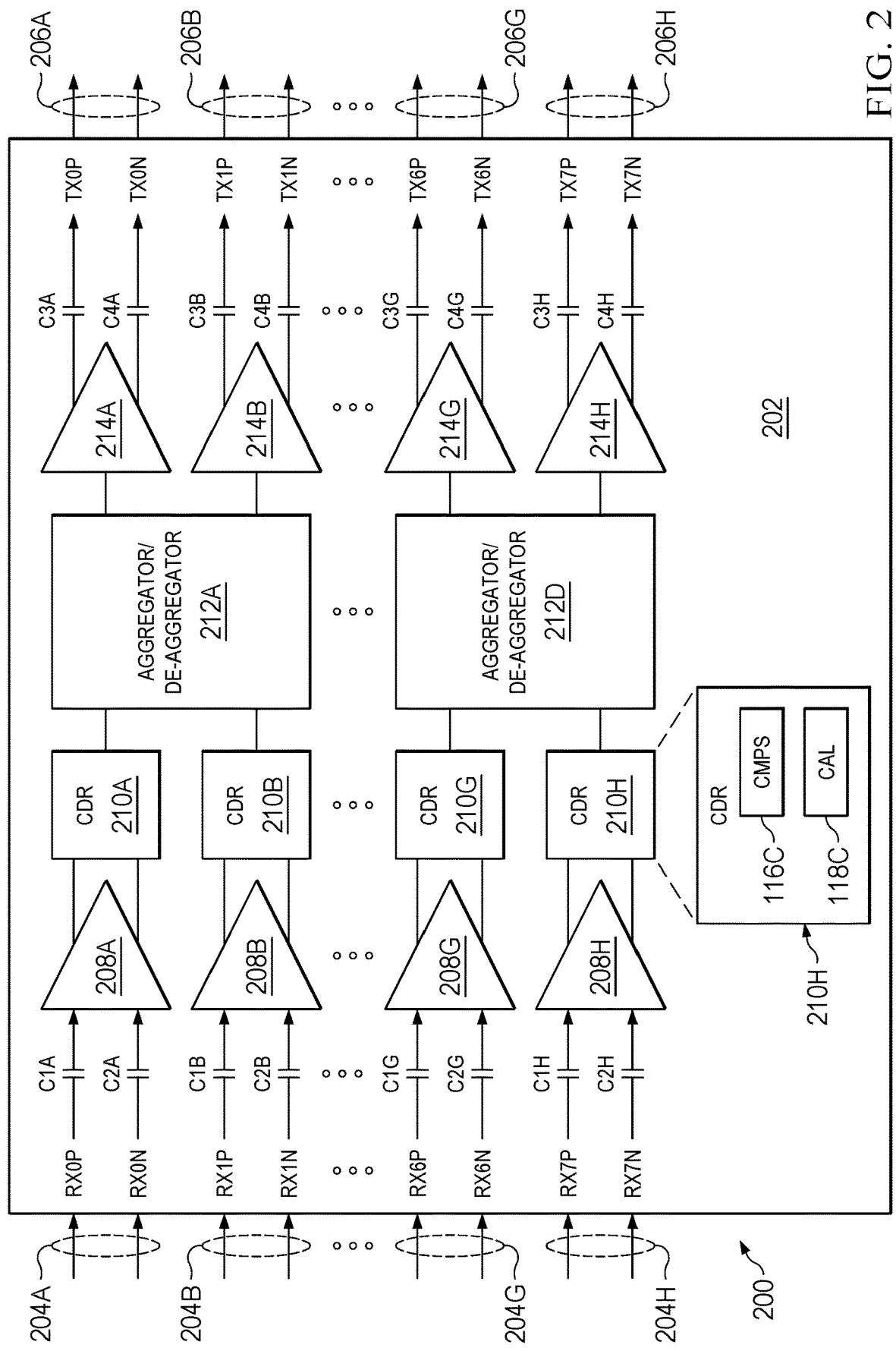
FIG. 2 is a diagram showing an example retimer including a comparator and related calibrator.

FIG. 2 is a diagram showing an example retimer 202 including comparators 116C and a related calibrator 118C. The retimer 202 is an example of the first retimer 110A or the second retimer 110B in FIG. 1. In FIG. 2, the comparators 116C are an example of the comparators 116A or the comparators 116B in FIG. 1. The calibrator 118C is an example of the calibrator 118A or the calibrator 118B in FIG. 1. In some examples, the retimer 202 is an integrated circuit (IC). As shown, the retimer 202 includes differential inputs 204A to 204H and differential outputs 206A to 206H.

The differential inputs 204A to 204H are examples of the first terminals 112A and 112B in FIG. 1. The differential output 206A to 206H are examples of the second terminals 114A and 114B in FIG. 1. In different examples, the number of differential inputs and outputs may vary.

Between the differential input 204A and the differential output 206A are various components including capacitors C1A and C2A, a first buffer circuit 208A, clock and data recovery (CDR) circuit 210A, an aggregator/de-aggregator circuit 212A, a second buffer circuit 214A, and capacitors C3A and C4A. Between the differential input 204B and the differential output 206B are various components including capacitors C1B and C2B, a first buffer circuit 208B, CDR circuit 210B, the aggregator/de-aggregator circuit 212A, a second buffer circuit 214B, and capacitors C3B and C4B. Between the differential input 204G and the differential output 206G are various components including capacitors C1G and C2G, a first buffer circuit 208G, CDR circuit 210G, an aggregator/de-aggregator circuit 212D, a second buffer circuit 214G, and capacitors C3G and C4G. Between the differential input 204H and the differential output 206H are various components including capacitors C1H and C2H, a first buffer circuit 208H, CDR circuit 210H, the aggregator/de-aggregator circuit 212D, a second buffer circuit 214H, and capacitors C3H and C4H.

In the example of FIG. 2, each of the differential inputs 204A to 204H has respective positive (P) and negative (N) inputs. Also, each of the differential outputs 206A to 206H has respective P and N inputs. Each of the capacitors C1A to C1H, C2A to C2H, C3A to C3H, and C4A to C4H has a first terminal and a second terminal. Each of the first buffer circuits 208A to 208H has a differential input (i.e., P and N inputs) and a differential output (i.e., P and N outputs). Each of the CDR circuits 210A to 210N has a differential input (i.e., P and N inputs) and an output. Each of the aggregator/de-aggregator circuits 212A to 212D has a first input, a second input, a first output, and a second output. Each of the second buffer circuits 214A to 214H has an input and a differential output (i.e., P and N outputs).

In some examples, the first terminal of the capacitor C1A is coupled to an RX0P input of the differential input 204A. The second terminal of the capacitor C1A is coupled to a P input of the first buffer circuit 208A. The first terminal of the capacitor C2A is coupled to an RX0N input of the differential input 204A. The second terminal of the capacitor C2A is coupled to an N input of the first buffer circuit 208A. The P output of the first buffer circuit 208A is coupled to a P input of the CDR circuit 210A. The N output of the first buffer circuit 208A is coupled to an N input of the CDR circuit 210A. The output of the CDR circuit 210A is coupled to the first input of the aggregator/de-aggregator circuit 212A. The first terminal of the capacitor C1B is coupled to an RX1P input of the differential input 204B. The second terminal of the capacitor C1B is coupled to a P input of the first buffer circuit 208B. The first terminal of the capacitor C2B is coupled to an RX1N input of the differential input 204B. The second terminal of the capacitor C2B is coupled to an N input of the first buffer circuit 208B. The P output of the first buffer circuit 208B is coupled to a P input of the CDR circuit 210B. The N output of the first buffer circuit 208B is coupled to an N input of the CDR circuit 210B. The output of the CDR circuit 210B is coupled to the second input of the aggregator/de-aggregator circuit 212A.

The first output of the aggregator/de-aggregator circuit 212A is coupled to the input of the second buffer circuit 214A. The P output of the second buffer circuit 214A is coupled to the first terminal of the capacitor C3A. The second terminal of the capacitor C3A is coupled to a TX0P output of the differential output 206A. The N output of the second buffer circuit 214A is coupled to the first terminal of the capacitor C4A. The second terminal of the capacitor C4A is coupled to a TX0N output of the differential output 206A. The second output of the aggregator/de-aggregator circuit 212A is coupled to the input of the second buffer circuit 214B. The P output of the second buffer circuit 214B is coupled to the first terminal of the capacitor C3B. The second terminal of the capacitor C3B is coupled to a TX1P output of the differential output 206B. The N output of the second buffer circuit 214B is coupled to the first terminal of the capacitor C4B. The second terminal of the capacitor C4B is coupled to a TX1N output of the differential output 206B.

In some examples, the first terminal of the capacitor C1G is coupled to an RX6P input of the differential input 204G. The second terminal of the capacitor C1G is coupled to a P input of the first buffer circuit 208G. The first terminal of the capacitor C2G is coupled to an RX6N input of the differential input 204G. The second terminal of the capacitor C2G is coupled to an N input of the first buffer circuit 208G. The P output of the first buffer circuit 208G is coupled to a P input of the CDR circuit 210G. The N output of the first buffer circuit 208G is coupled to an N input of the CDR circuit 210G. The output of the CDR circuit 210G is coupled to the first input of the aggregator/de-aggregator circuit 212D. The first terminal of the capacitor C1H is coupled to an RX7P input of the differential input 204H. The second terminal of the capacitor C1H is coupled to a P input of the first buffer circuit 208H. The first terminal of the capacitor C2H is coupled to an RX7N input of the differential input 204H. The second terminal of the capacitor C2H is coupled to an N input of the first buffer circuit 208H. The P output of the first buffer circuit 208H is coupled to a P input of the CDR circuit 210H. The N output of the first buffer circuit 208H is coupled to an N input of the CDR circuit 210H. The output of the CDR circuit 210H is coupled to the second input of the aggregator/de-aggregator circuit 212D.

The first output of the aggregator/de-aggregator circuit 212D is coupled to the input of the second buffer circuit 214G. The P output of the second buffer circuit 214G is coupled to the first terminal of the capacitor C3G. The second terminal of the capacitor C3G is coupled to a TX6P output of the differential output 206G. The N output of the second buffer circuit 214G is coupled to the first terminal of the capacitor C4G. The second terminal of the capacitor C4G is coupled to a TX6N output of the differential output 206G. The second output of the aggregator/de-aggregator circuit 212D is coupled to the input of the second buffer circuit 214H. The P output of the second buffer circuit 214H is coupled to the first terminal of the capacitor C3H. The second terminal of the capacitor C3H is coupled to a TX7P output of the differential output 206H. The N output of the second buffer circuit 214H is coupled to the first terminal of the capacitor C4H. The second terminal of the capacitor C4H is coupled to a TX7N output of the differential output 206H. Similar components and couplings (not shown) are used between the differential inputs 204C and the differential outputs 206C, between the differential inputs 204D and the differential outputs 206D, between the differential inputs 204E and the differential outputs 206E, and between differential inputs 204F and the differential outputs 206F.

In the example of FIG. 2, a plurality of retimer channels are represented, where each retimer channel includes input terminals, input conditioning circuitry, CDR circuitry, retimer circuitry, output conditioning circuitry, and output terminals. The input terminals are coupled to a first communication interface (e.g., a serial data interface) and receive an input signal according to a protocol of the first communication interface. The input conditioning circuitry filters undesired frequency components from the input signal and/or changes the voltage and/or current levels of the input signal. The CDR circuitry recovers a clock signal and data related to the input signal. The retimer circuitry prepares new data based on the recovered data and provides a new clock signal. The output conditioning circuitry filters undesired frequency components from the output signal and/or changes the voltage and/or current levels of the output signal. The output terminals are coupled to a second communication interface (e.g., a serial communication interface) and provide the output signal according to a protocol of the second communication interface. For example, a first retimer channel includes: the differential input 204A as input terminals; the capacitors C1A and C2A, and the first buffer circuit 208A as input conditioning circuitry; the CDR circuit 210A as CDR circuitry; the aggregator/de-aggregator circuit 212A as retimer circuitry; the second buffer circuit 214A, and the capacitors C3A and C4A as output conditioning circuitry; and the differential output 206A as output terminals. Eight such retimer channels are represented in FIG. 2.

In some examples, the retimer 202 is an eight-channel multi-rate retimer with integrated signal conditioning. The retimer 202 extends the reach and robustness of long, lossy, crosstalk impaired high-speed serial links. Each channel in the retimer 202 independently locks to symbol rates (e.g., PAM4 and NRZ) over a range of supported data rates (e.g., 19.6 to 28.9 GBd or to any supported sub-rate). The integrated CDR function is ideal for front-port optical module applications to reset the jitter budget and retime high-speed serial data. Without limitation, the retimer 202 may support individual lane forward error correction (FEC) pass-through, automatic lane rate switching for CDR lock up to five different combinations of baud rates and modulation types without host intervention, continuously adaptive continuous-time linear equalizer (CTLE), RX feedforward equalizer (FFE), decision feedback equalizer (DFE), and/or a programmable, low-jitter TX feedforward equalizer (FFE) filter. Such features enable reach extension for lossy interconnects such as direct-attach copper (DAC) cables and backplane.

In some examples, comparators (e.g., the comparators 116C or similar comparators) of each of the CDR circuits 210A to 210H may compare input data voltages to different thresholds and provide comparison results. The accuracy of each comparator and related operations is affected by the respective offset of each comparator. The offset of each comparator varies from other comparators and may change over time. In order to improve the accuracy of each comparator and related operations, a calibrator (e.g., the calibrator 118C) provides an adjustment control signal to each comparator. In some examples, the calibrator 118C determines the adjustment control signal based on indirect offset estimation. One example of indirect offset estimation, performed by the calibrator 118C, includes: obtaining an offset estimation model; receiving input voltages; estimating a comparator offset responsive to the offset estimation model and the input voltages; and providing adjustment control signals to the comparators 116C responsive to the estimated comparator offsets. In some examples, each of the CDR circuits 210A to 210H has a set of comparators. In some examples, each of the CDR circuits 210A to 210H has its own calibrator for its respective comparators. In some examples, some or all of the CDR circuits 210A to 210H share a calibrator. Each such calibrator may include a reference comparator, a controller, and/or other circuitry (see e.g., FIGS. 5 and 7).

Figure 3:
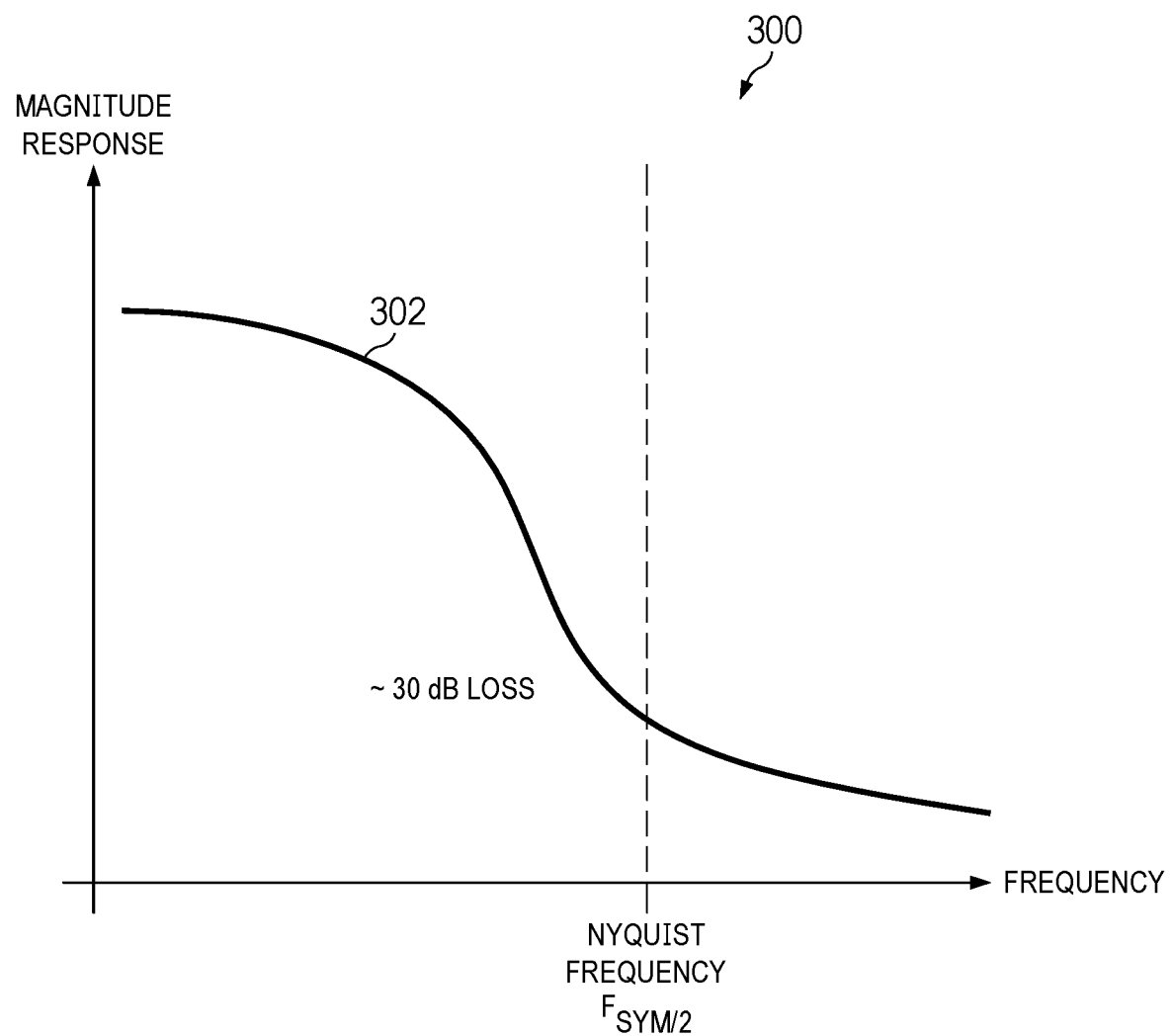
FIG. 3 is a graph showing an example frequency response.

FIG. 3 is a graph 300 showing an example frequency response. In graph 300, the curve 302 represents signal magnitude. As shown, the signal magnitude drops as the frequency increases, resulting in a loss (e.g., about 30 dB) at the Nyquist frequency ($F_{sym}/2$, where $F_{sym}$ is the symbol frequency). To improve bit error rates, comparators used for signal conditioning operations are calibrated based on what is referred to as an indirect offset estimation, as described herein.

Figure 4B:
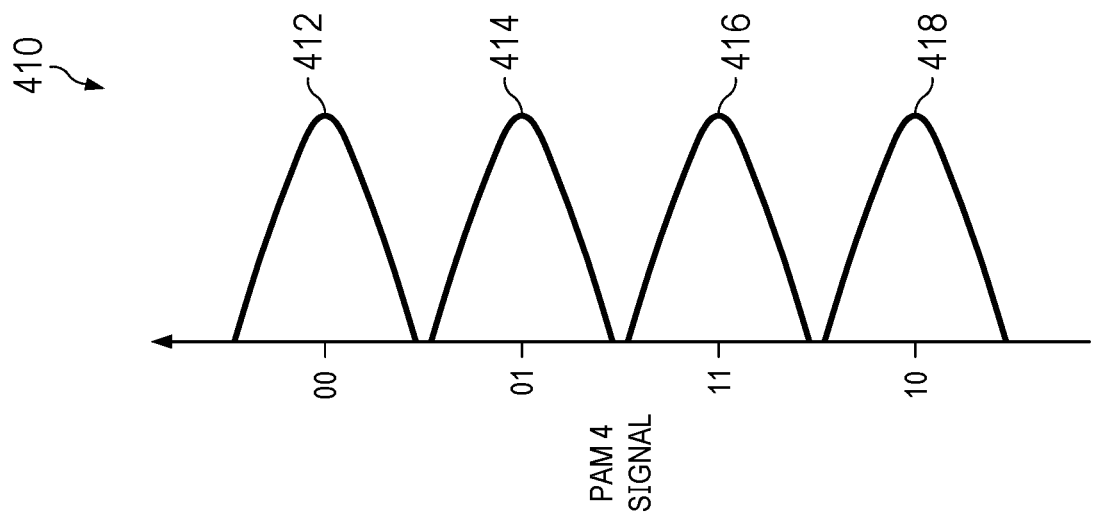
FIG. 4B is a diagram showing an example pulse-amplitude 4-level modulation (PAM4) mapping.
Figure 4A:
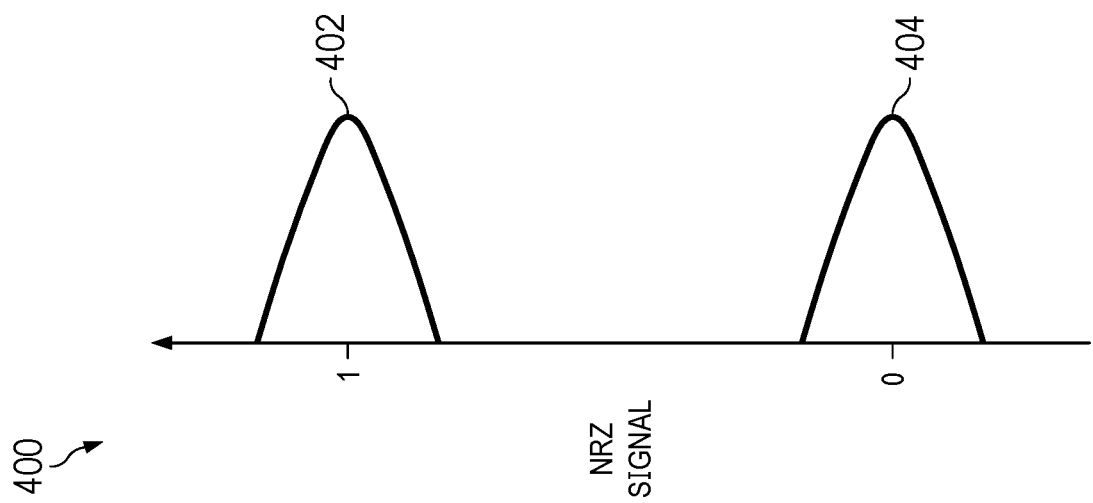
FIG. 4A is a diagram showing an example non-return-to-zero modulation (NRZ) mapping.

FIG. 4A is a diagram 400 showing an example histogram of equalized non-return-to-zero modulation (NRZ) signals. As shown in diagram 400, the equalized NRZ signals are received into a logical "1" region 402 and logical "0" region 404.

FIG. 4B is a diagram 410 showing an example histogram of pulse-amplitude 4-level modulation (PAM4) signals. As shown in diagram 410, PAM4 signals are received into a logical "00" region 412, a logical "01" region 414, a logical "11" region 416, and a logical "10" region 418. Under suitable conditions, with optimum equalizer settings, histograms such as those in the diagrams 400 and 410 include peaks at the nominal signal transmission level and a valley at the mid-point between adjacent signal transmission levels. Such peaks are referred to herein as statistically rich regions and each valley is referred to herein as a statistically deficient region.

Figure 5:
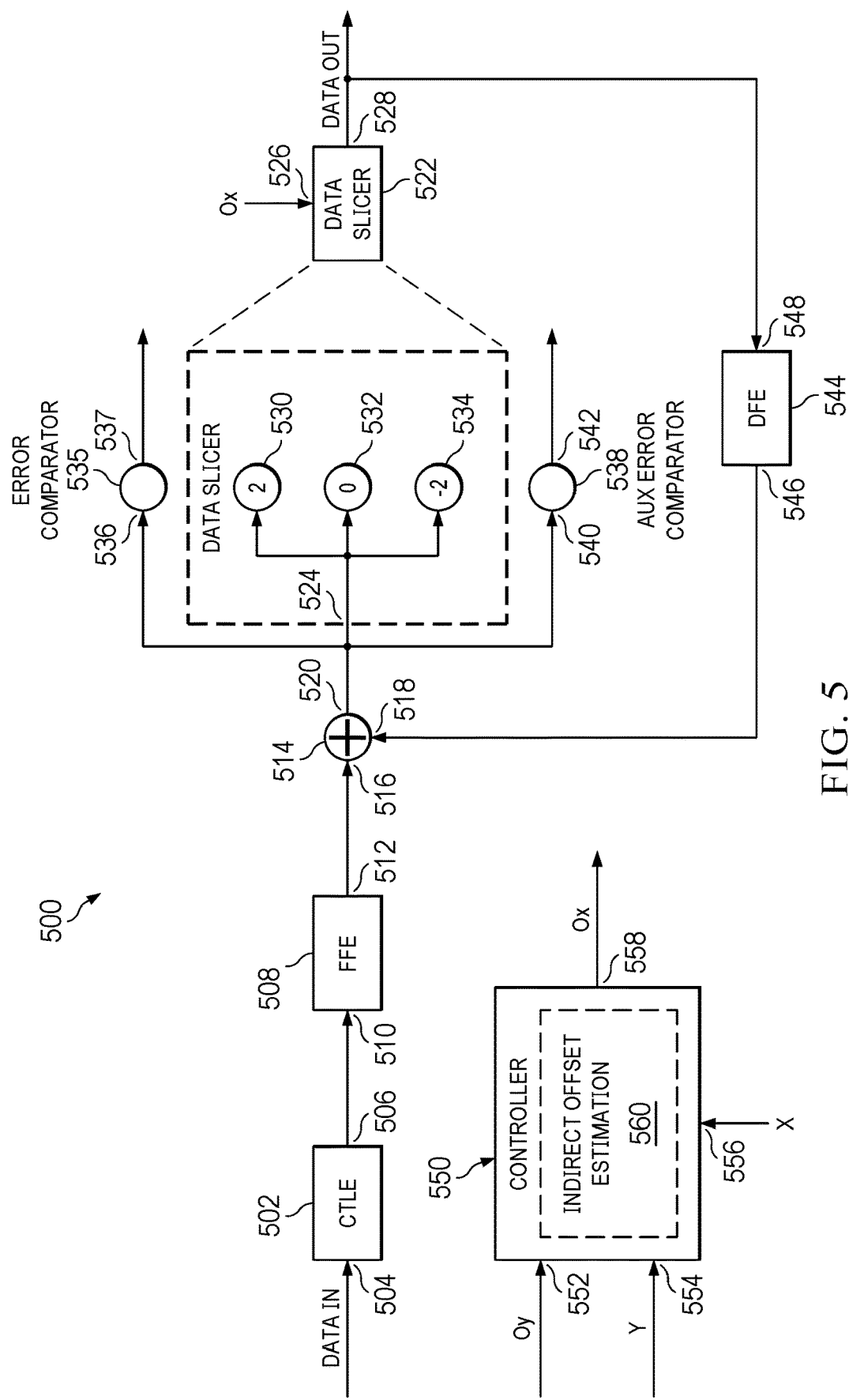
FIG. 5 is a diagram showing an example receiver.

FIG. 5 is a diagram showing an example receiver 500. In different examples, the comparator 116A and related calibrator 118A of FIG. 1, the comparator 116B and related calibrator 118B of FIG. 1, or the comparator 116C and the related calibrator 118C may be components of a receiver such as the receiver 500 of FIG. 5. Also, the retimer 200 of FIG. 2 may include a receiver such as the receiver 500. As shown, the receiver 500 includes a CTLE circuit 502, an FFE circuit 508, a combine circuit 514, a data slicer 522, a DFE circuit 544, first comparator 535, a second comparator 538, and a controller 550. In some examples, the controller 550 is a processor. In other examples, the controller 550 includes logic circuitry designed to perform the functions described herein. In some examples, the logic circuitry are based on register-transfer level (RTL) designs.

The CTLE circuit 502 has an input and an output. The FFE circuit 508 has an input and an output. The combine circuit 514 has a first input 516, a second input 518, and an output 520. The data slicer 522 has a first input 524, a second input 526, and an output 528. The first comparator 535 has an input 536 and an output 537. The second comparator 538 has an input 540 and an output 542. The DFE circuit 544 has an input 546 and an output 548. The controller 550 has a first input 552, a second input 554, a third input 556, and an output 558. In some examples, the controller 550 may have a single input interface instead of the first, second, and third inputs 552, 554, and 556.

In the example of FIG. 5, the input 504 of the CTLE circuit 502 receives input data. The output 506 of the CTLE circuit 502 is coupled to the input 510 of the FFE circuit 508. The output 512 of the FFE circuit 508 is coupled to the first input 516 of the combine circuit 514. The second input 518 of the combine circuit 514 is coupled to the output 548 of the DFE circuit 544. The output 520 of the combine circuit 514 is coupled to input 536 of the first comparator 535. The output 537 of the first comparator 535 provides an error result. The output 520 of the combine circuit 514 is also coupled to input 540 of the second comparator 538. The output 542 of the second comparator 538 provides an auxiliary error result. The output 520 of the combine circuit 514 is also coupled to the first input 524 of the data slicer 522. The second input 526 of the data slicer 522 is coupled to the output 558 of the controller 550. The output 528 of the data slicer 522 is coupled to the input 546 of the DFE circuit 544. In the example of FIG. 5, the data slicer 522 includes comparators 530, 532, and 534. Also, the controller 550 includes indirect offset estimation instructions 560. In some examples, the receiver 500 may include memory (not shown) that stores the indirect offset estimation instructions 560.

The receiver 500 operates to: obtain input data (Data In); perform equalization on the input data using the CTLE circuit 502, the FFE circuit 508, the combine circuit 514, the data slicer 522, and the DFE circuit 544; and provide output data (Data Out) responsive to the input data and the equalization. In some examples, equalization operations of the receiver 500 involves selection of an optimal setting by the CTLE circuit 502, adaptation of the FFE circuit 508, and adaptation of the DFE circuit. In some examples, CTLE setting selection and data slicer non-linearity (NL) correction uses signal statistics (e.g., EYE diagram analysis) at the slicer input.

Before obtaining the input data, comparators of the receiver 500 such as the comparators 530, 532, 534, the first comparator 535, and/or the second comparator 538 may be calibrated. The comparator calibration operations may be performed at start-up, periodically, or in response to a calibration trigger such as temperature drift. In the example of FIG. 5, the controller 550 performs the comparator calibration operations using the indirect offset estimation instructions 560. When executed, the indirect offset estimation instructions 560 may cause the controller 550 to: obtain an offset estimation model; receive input voltages; estimate comparator offsets responsive to the offset estimation model and the input voltages; and provide adjustment control signals responsive to the estimated comparator offsets.

Figure 6:
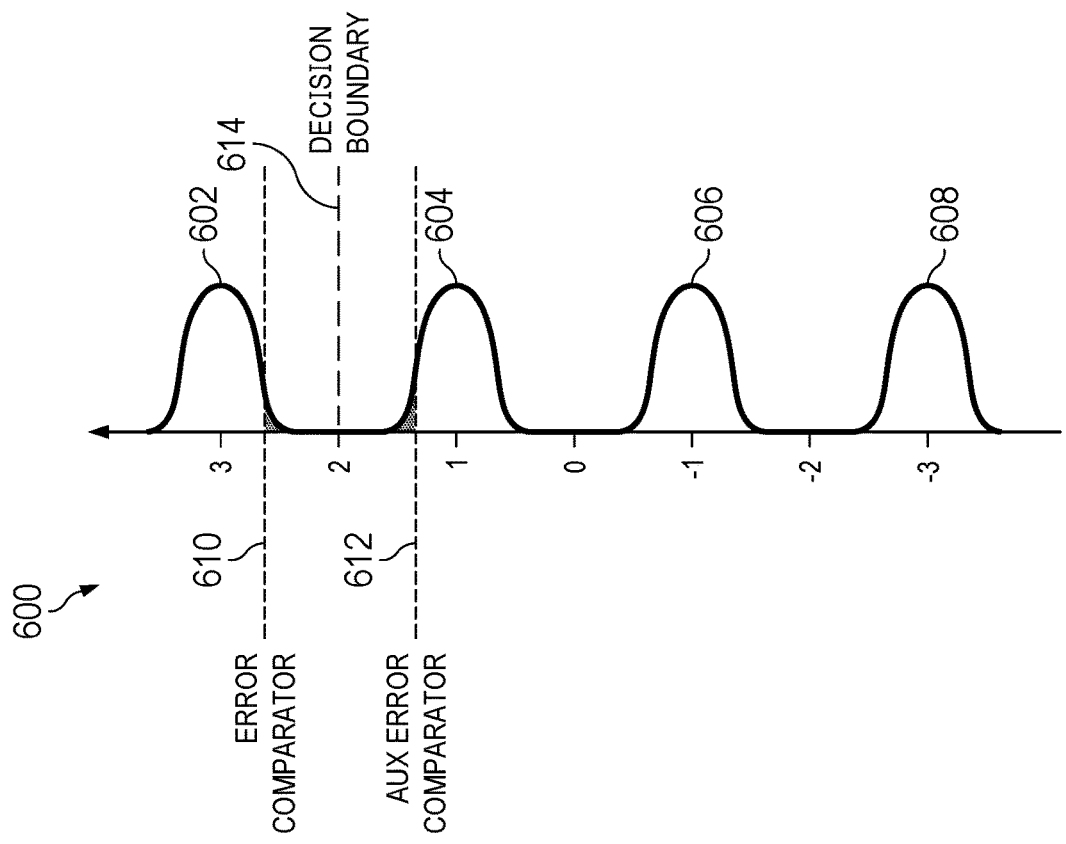
FIG. 6 is a graph showing an example data slicer mapping and related reference levels.

FIG. 6 is a graph 600 showing an example histogram of received data for a PAM4 system. In the graph 600, the voltage levels range from +3 to −3. The voltage levels of +3 to −3 may represent volts or normalized values. In the graph 600, received input voltages are mapped to a +3 symbol 602, a +1 symbol 604, a −1 symbol 606, and a −3 symbol 608. In some examples, decision boundaries are used to demarcate the region between the different symbols 602, 604, 606, and 608. For example, decision boundary 614 demarcates the region between +3 and +1 symbols. In some examples, mapping input voltages to the symbols 602, 604, 606, and 608 involves comparators such as the comparators 530, 532, and 534 of the data slicer 522. For example, data may be sliced at the voltage levels −2, 0, and +2 to provide the input voltage to symbol mapping of graph 600. Such comparators are prone to offset errors. In the context of a data slicer, offset in data slicer comparators directly results in bit-error rate (BER) degradation.

In the graph 600, a first reference level 610 and a second reference level 612 are shown. The first reference level 610 is an example voltage level at which the first comparator 535 is used to obtain signal statistics. The second reference level 612 is another example voltage level at which the second comparator 538 is used to obtain signal statistics. The first reference level 610 related to the first comparator 535 and the second reference level 612 related to the second comparator 538 are adjustable. In some examples, the first and second reference levels 610 and 612 are used to observe signal statistics at the input of slicer and for equalization adaptation. The signal statistics measurements affect system performance. In some scenarios, both the first comparator 535 and the second comparator 538 are set to measure the number of hits at appropriate voltage levels. Also, the CTLE setting selection may use signal statistics around '0'. The best CTLE setting is the one that results in the widest EYE diagram opening around '0'. Analog circuitry has inherent offsets related to the first comparator 535 and the second comparator 538. The offsets may result in a bad CTLE setting selection or bad data slicer NL correction, resulting in worse BER. The offsets for the first comparator 535 and the second comparator 538 may be: temperature dependent; and reference level dependent. To account for the temperature dependency, periodic calibration may be performed. To account for reference level dependency, a calibration for each level may be performed.

Figure 7:
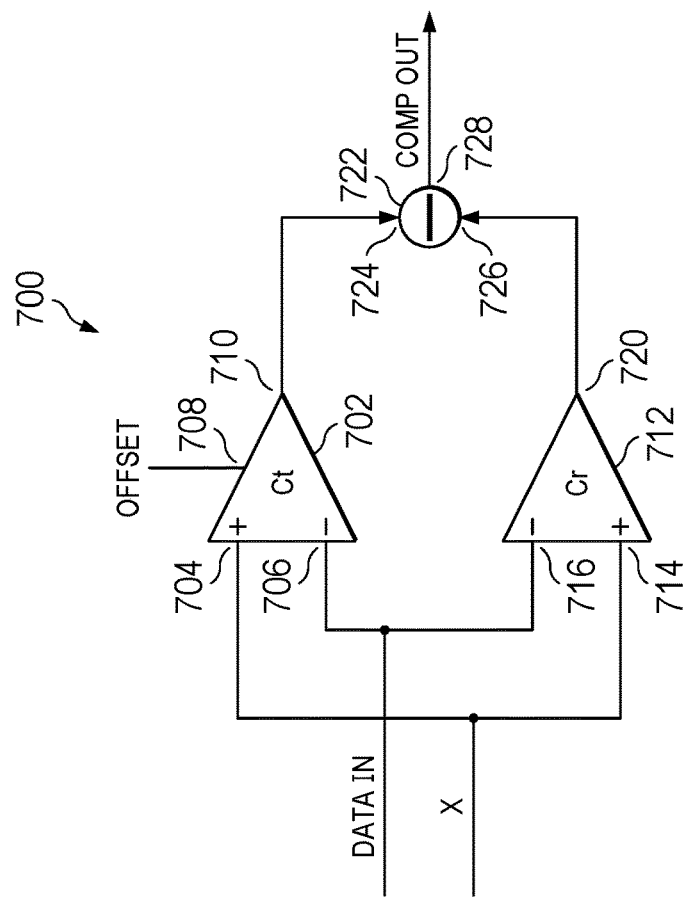
FIG. 7 is a diagram showing example circuitry including an adjustable comparator and a reference comparator.

FIG. 7 is a diagram showing example circuitry 700 including an adjustable comparator 702, a reference comparator 712, and a combine circuit 722. In some examples, the adjustable comparator 702 is an example of the comparator 530, the comparator 532, the comparator 534, the first comparator 535, or the second comparator 538. As shown, the adjustable comparator 702 has a first input 704, a second input 706, an adjustment terminal 708, and an output 710. The reference comparator 712 has a first input 714, a second input 716, and an output 720. The combine circuit 722 has a first input 724, a second input 726, and an output 728. The output 710 of the adjustable comparator 702 is coupled to the first input 724 of the combine circuit 722. The output 720 of the reference comparator 712 is coupled to the second input 726 of the combine circuit 722.

In operation, the adjustable comparator 702: receives a reference level ("X") at its first input 704; receives input data at its second input 706; receives an adjustment control signal at its adjustment terminal 708; and provides a first comparison result at its output 710 responsive to the threshold, the input data, and the adjustment control signal. The reference comparator 712: receives the reference level ("X") at its first input 714; receives input data at its second input 716; and provides a second comparison result at its output 720 responsive to the threshold and the input data. The combine circuit 722 operates to: receive the first comparison result at its first input 724; receive the second comparison results at its second input 726; and provide the difference (Comp Out) between the first and second comparison results at its output 728. In some examples, the adjustment control signal provided to the adjustable comparator 702 is updated based on Comp Out.

In some examples, the reference comparator 712 is calibrated first by providing the same reference level (e.g., the reference level 'X') to its inputs, before using the reference comparator 712 to calibrate Ct. This method of calibration is not used for the adjustable comparator 702 as the circuitry to achieve this will load the nearby stages and increase power consumption. In some examples, the reference comparator 712 and the adjustable comparator 702 receive with same reference level 'X' and the input data ("Data In"). If the adjustable comparator 702 has offset of 0 both the adjustable comparator 702 and the reference comparator 712 will provide identical outputs. During reference level "X" calibration, the offset of adjustable comparator 702 is adjusted until the output statistics of both comparators become similar. For successful offset calibration of the reference level "X", the input data statistics should be rich near the reference level "X". In some examples, calibration works for the voltage levels +3, +1, −1, and −3, but not for voltage levels +2, 0, and −2.

Figure 8:
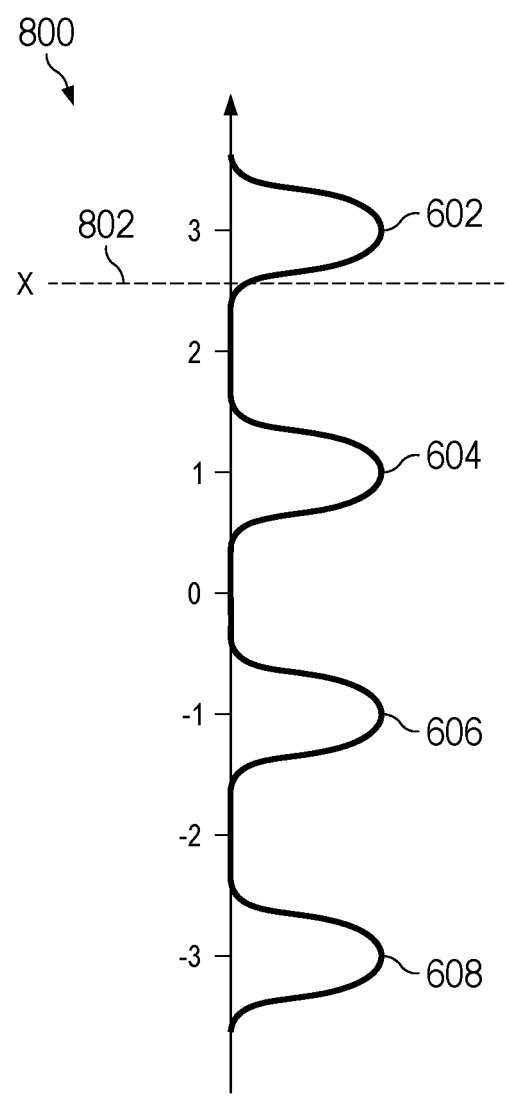
FIG. 8 is a graph showing an example data slicer mapping and a related reference level.

FIG. 8 is a graph 800 showing an example data slicer mapping and a related reference level. The graph 800 is the same as the graph 600 except the reference level "X" 802 is shown instead of the first and second reference levels 610 and 612. During offset calibration, the reference level "X" is selected to be a voltage level at which the input data is statistically rich. Based on offset information obtained using the reference level "X", an adjustable comparator such as the comparators 530, 532, and 534 of the data slicer 522, the first comparator 535, or the second comparator 538 may be calibrated.

Figure 9:
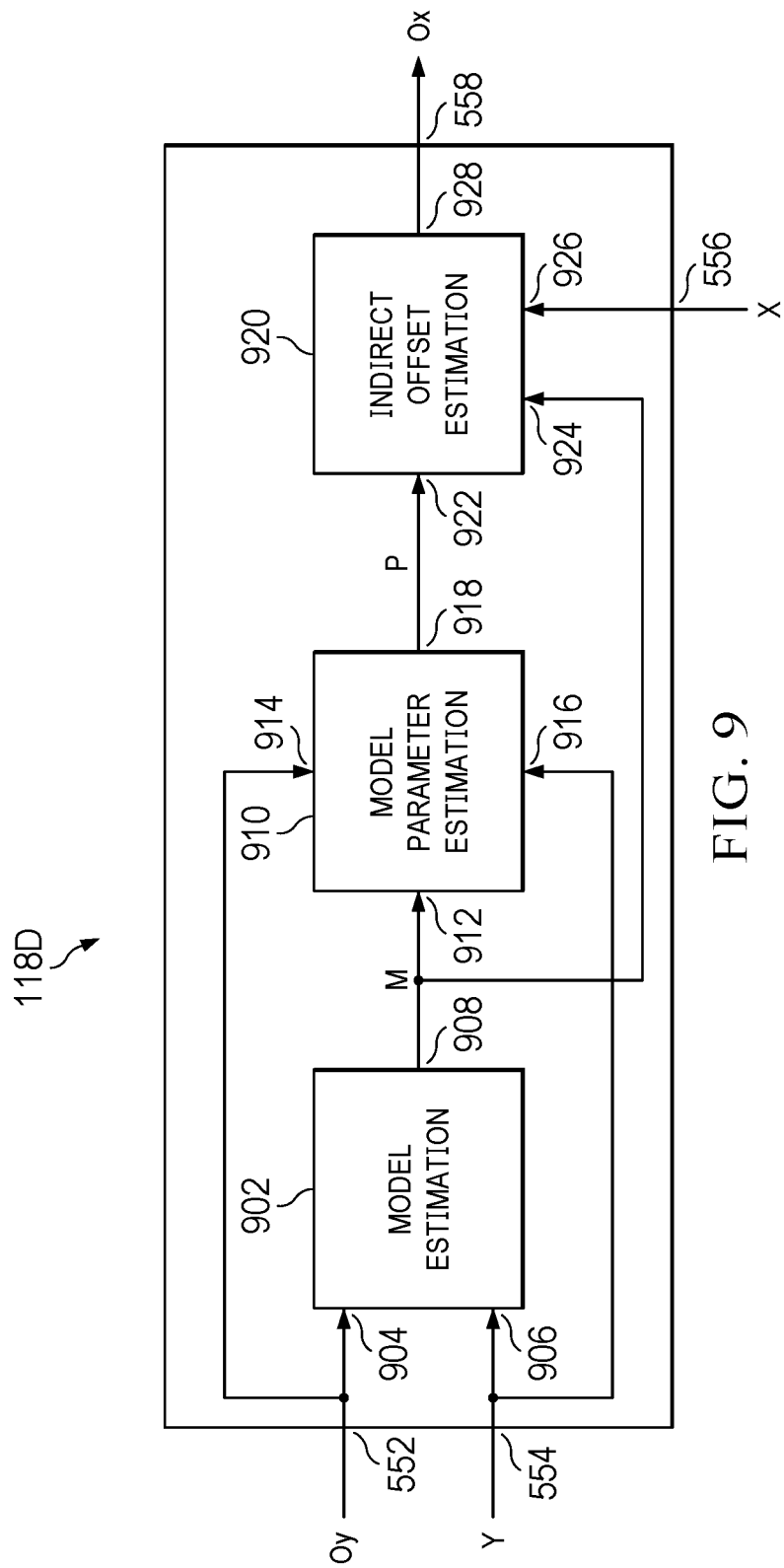
FIG. 9 is a diagram showing an example calibrator.

FIG. 9 is a diagram showing an example calibrator 118D. The calibrator 118D is an example of the calibrator 118A in FIG. 1, the calibrator 118B in FIG. 1, the calibrator 118C in FIG. 2, or the controller 550 in FIG. 5. In the example of FIG. 9, the calibrator 118D has the first input 552, the second input 554, the third input 556, and the output 558 described from the controller 550. In some examples, the calibrator 118D may have a single input interface instead of the first, second, and third inputs 552, 554, and 556.

As shown, the calibrator 118D includes a model estimation block 902, a model parameter estimation block 910, and an indirect offset estimation block 920. Each of the model estimation block 902, the model parameter estimation block 910, and the indirect offset estimation block 920 may be a circuit or software routine. In the example of FIG. 9, the model estimation block 902 has a first input 904, a second input 906, and an output 908. The model parameter estimation block 910 has a first input 912, a second input 914, and third input 916, and an output 918. The indirect offset estimation block 920 has a first input 922, a second input 924, a third input 926, and an output 928.

The first input 904 of the model estimation block 902 is coupled to the first input 552 of the calibrator 118D. The second input 906 of the model estimation block 902 is coupled to the second input 554 of the calibrator 118D. The output 908 of the model estimation block 902 is coupled to the first input 912 of the model parameter estimation block 910. The second input 914 of the model parameter estimation block 910 is coupled to the first input 552 of the calibrator 118D. The third input 916 of the model parameter estimation block 910 is coupled to the second input 554 of the calibrator 118D. The output 918 of the model parameter estimation block 910 is coupled to the first input 922 of the indirect offset estimation block 920. The second input 924 of the indirect offset estimation block 920 is coupled to the output 908 of the model estimation block 902. The third input 926 of the indirect offset estimation block 920 is coupled to the third input 556 of the calibrator 118D. The output 928 of the indirect offset estimation block 920 is coupled to the output 558 of the calibrator 118D.

Direct-current (DC) offset refers to the offset between a reference voltage and an input voltage at which a comparator's output changes from one logic level to the other. DC offset correction of comparators (e.g., data and/or auxiliary slicers) in serializer/deserializer (SERDES) or retimers may suffer from tracking issues around decision boundaries due to low signal density. In some examples, auxiliary slicers are used to estimate the quality of equalization by counting the density of signal hits in a region around the decision boundaries. Quality of equalization may also be used for: a) adjustment of slicer placement; and b) CTLE selection. High levels of residual offsets can cause convergence issues in algorithms that make use of signal statistics around decision boundaries.

In retimer design, the DC offset shows a nearly linear relation with the slicer threshold value. By estimating the DC offset at a signal rich level, the calibrator 118D obtains high quality DC offset estimates, which are then linearly interpolated to all other slicer levels. While slicer DC offset is normally estimated by looking at some characteristics of a slicer at the desired operating condition (e.g., the slicer threshold), the calibrator 118D estimates the offset at a different threshold level (which has high signal density and hence gives a higher quality DC offset estimate) and predicts the offsets at other threshold levels. Compared to other calibration options, the calibrator 118D employs a calibration technique that is cleaner both in power-up and background estimation stages. Also, the estimation time is cut down because the estimation needs to be done only at a few threshold levels. The remaining DC offsets can be estimated using modeling as described herein. The calibrator 118D operates to: receive an offset (Oy) for the reference level "Y" at its first input 552; receive a reference level "Y" at its second input 554; use the model estimation block 902 to provide an offset estimation model M responsive to Y and Oy; use the model parameter estimation block 910 to estimate a parameter P of the offset estimation model M responsive to Y, Oy, and the offset estimation model M; receive a reference level "X" different than the reference level "Y"; use the indirect offset estimation block 920 to determine an offset ("Ox") responsive to the reference level "X", the offset estimation model M, and the estimated parameter P; and generate an adjustment control signal responsive to the determined offset Ox. In some examples, calibrator 118D receives multiple Y and Oy pairs; and performs indirect offset estimation based on the multiple Y and Oy pairs.

In the example of FIG. 9, the offset Oy for each of a select number of reference levels Y is determined by measuring or sampling the input voltages to a comparator relative to each respective reference level Y that triggers an output change in a comparator from one logic level to the other. In some examples, the reference levels Y and the related offset Oy shown in FIG. 9 are obtained previously by the calibrator 118D based on application of a select set of reference levels Y to the comparators to be calibrated and recording the offset. In other words, the calibrator 118D may include a signal generator (e.g., a digital-to-analog converter (DAC)) and storage (e.g., memory or registers) as needed to determine Oy for a select number of reference levels Y. As noted herein, the reference levels Y used for calibration may be selected at statistically rich levels to improve the accuracy of the related offsets Oy. The reference levels X in FIG. 9 correspond to reference levels of interest for a particular circuit (e.g., a retimer or SERDES) and its operations (e.g., data or auxiliary slicer levels). The reference levels X may be predetermined for a particular circuit and/or for particular operations and stored in memory (e.g., in a table). The circuitry used to generate the reference levels X may include a digital controller, memory, a DAC, adjustable current sources, resistor strings, and/or other circuitry. The offsets Ox in FIG. 9 are obtained by the calibrator 118D based on the reference levels X and the indirection offset estimation block 920. The offsets Ox may be stored and/or analyzed by the calibrator 118D to determine an appropriate offset correction. For example, the calibrator 118D may include analog circuitry and/or digital circuitry to compare the offsets Ox to different levels and select an appropriate offset correction. The offset correction is applied as needed to each calibrator for its particular reference level X. In some examples, the offset estimation model M generates a linear model for offset estimation from data sufficient levels for the reference level Y and the offset Oy. For PAM4 data symbols, +/−3, +/−1 levels are rich in signal statistics. In some examples, the estimated model parameter is a slope or curve of a line. In some examples, Ox is estimated indirectly for data deficient points responsive to X, the offset estimation model M, and the model parameter P, where the offset estimation model M and the model parameter P are determined using data rich points. In some examples, the indirect offset estimation technique of FIG. 9 may be used to improve the accuracy of comparators, such as the first comparator 535 and/or the second comparator 538 in FIG. 5 at the −2/+2 levels. In some examples, indirect offset estimation method can be extended to any comparators with an adjustable reference level. In some examples, a data slicer is calibrated at a reference level (e.g., +2).

In some examples, calibration is performed on a comparator during an offline interval of the comparator. If available, a second comparator may be used to perform calibration during an online interval of a first comparator. For example, when a first comparator is being calibrated, a second comparator that is already calibrated may be used for receiver operations. Calibration operations may be repeated as needed during such offline intervals or online intervals. In some examples, the reference comparator 712 in FIG. 7 is used as a second comparator to estimate the offset of a first comparator at data sufficient points (e.g., −3/−1/+1/+3) and can be used to determine the offset of the first comparator at +2. After calibration, the first comparator may then be used for receiver operations, such as signal conditioning, as described herein. In the use case when a data comparator needs to be calibrated (which cannot be made offline), the first and second comparators may perform the operations of the adjustable comparator 702. When the first comparator goes for calibration the second comparator can be used for receiver operations. During calibration, the reference comparator 712 is used to estimate the offsets of the first comparator at data sufficient points (e.g., −3/−1/+1/+3) and offsets at −2/0/+2 are estimated.

Figure 10:
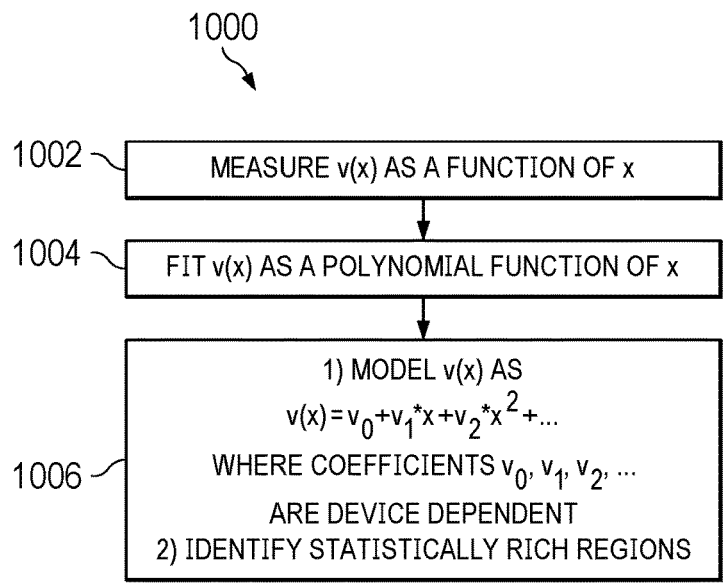
FIG. 10 is a flowchart showing an example method for obtaining a comparator offset estimation model.

FIG. 10 is a flowchart showing an example method 1000 for obtaining a comparator offset estimation model. The method 1000 is performed, for example, by the model estimation block 902 of the calibrator 118D of FIG. 9. In some examples, the method 1000 is performed offline (i.e., offline modeling) and is performed once for each offset used to determine the offset estimation model M. As shown, the method 1000 includes measuring an offset v(x) as a function of input voltage x at block 1002. At block 1004, v(x) is fit as a polynomial function of the input voltage x. At block 1006, v(x) is modeled as $v(x)=v_0+v_1*x+v_2*x^2+\ldots$, where the coefficients $v_0, v_1, v_2, \ldots$ are device dependent. Also, statistically rich regions are identified at block 1006.

Figure 11:
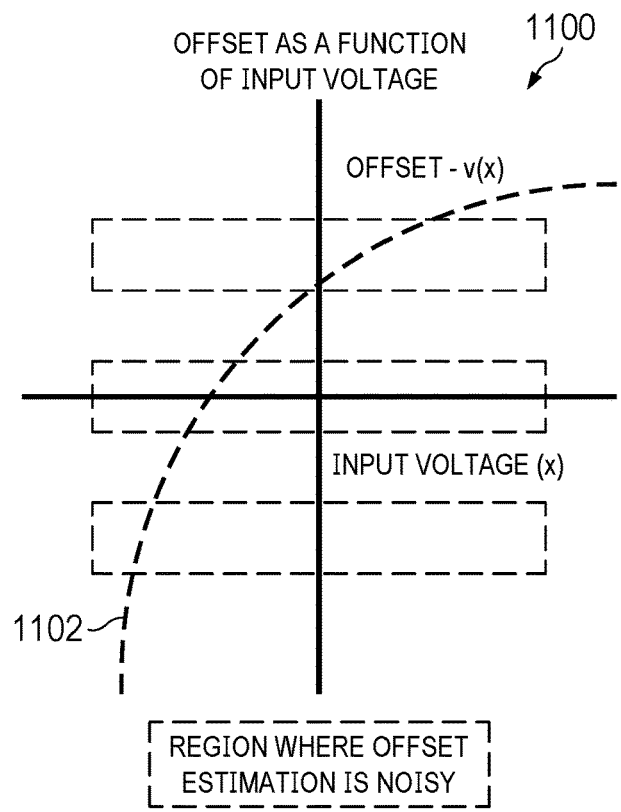
FIG. 11 is a graph showing a comparator offset estimation model as a curve.

FIG. 11 is a graph 1100 showing a comparator offset estimation model as a curve 1102. In graph 1100, the curve 1102 represents offset as a function of the input voltage x. In some areas, offset estimation as a function of the input voltage x is more noisy (i.e., there is a higher uncertainty) than in other areas. In some examples, a comparator offset estimation model is determined by estimating offset as a function of the input voltage x while avoiding the noisier areas.

Figure 12:
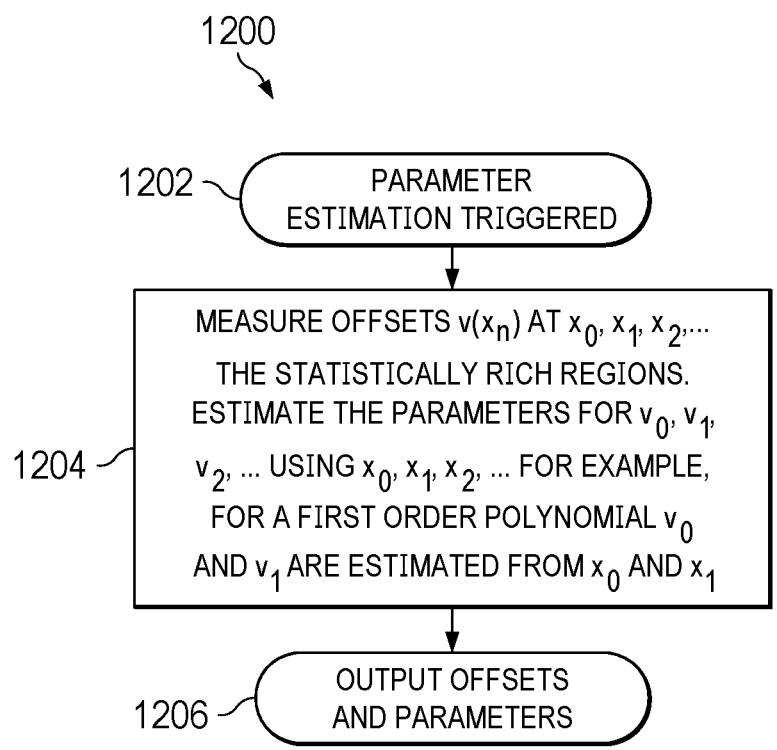
FIG. 12 is a flowchart showing an example method for estimating a parameter of a comparator offset estimation model.

FIG. 12 is a flowchart showing an example method 1200 for estimating a parameter of a comparator offset estimation model. The method 1200 is performed, for example, by the model parameter estimation block 910 of the calibrator 118D of FIG. 9. In some examples, parameter estimation is triggered at block 1202. The trigger at block 1202 may be a time-based or schedule-based trigger, a temperature drift trigger, or other trigger. At block 1204, offsets v(x) at $x_0, x_1,$ and $x_2, \ldots$ are measured at statistically rich regions, where $x_0, x_1,$ and $x_2, \ldots$ refer to different reference levels. Also, parameters for $v_0, v_1,$ and $v_2, \ldots$ are estimated using $x_0, x_1,$ and $x_2, \ldots$ at block 1204, where $v_0, v_1,$ and $v_2, \ldots$ refer to different offsets. At block 1206, the offsets (e.g., $v_0, v_1,$ and $v_2, \ldots$) and parameters determined at block 1204 are output.

Figure 13:
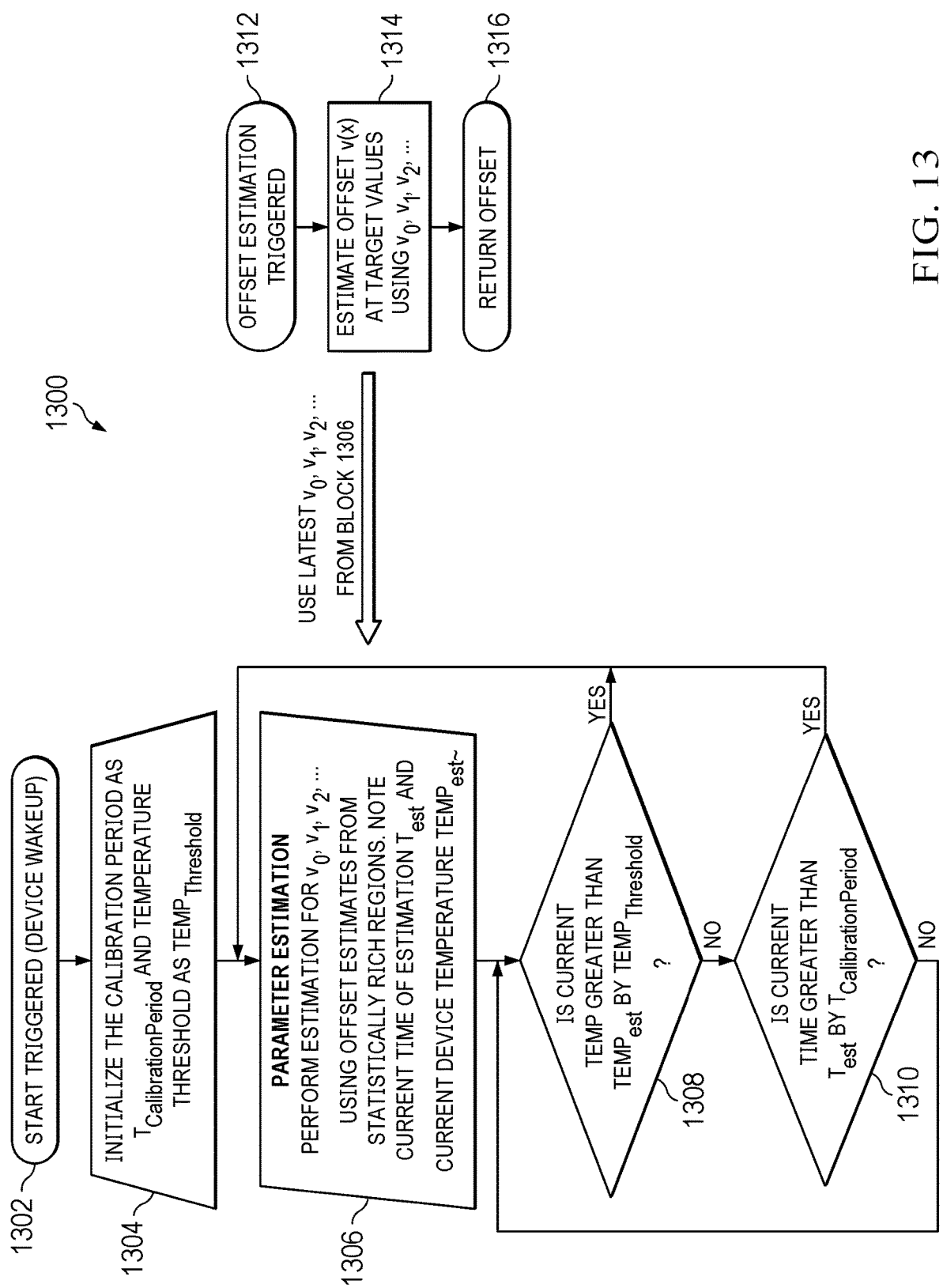
FIG. 13 is a flowchart showing an example method for obtaining a comparator offset using a comparator offset estimation model.

FIG. 13 is a flowchart showing an example method 1300 for obtaining a comparator offset using a comparator offset estimation model. The method 1300 is performed, for example, by the indirect offset estimation block 920 of the calibrator 118D of FIG. 9. In some examples, a start is triggered at block 1302. In some examples, the trigger of block 1302 may be a device wakeup, a time-based or schedule-based trigger, or temperature drift trigger. At block 1304, a calibration period ($T_{Calibrationperiod}$) period and temperature threshold ($Temp_{Threshold}$) are initialized. At block 1306, parameter estimation is performed for $v_0, v_1,$ and $v_2, \ldots$ based on statistically rich regions. In some examples, the parameter estimation of block 1306 notes a current time of estimation ($T_{est}$) and the current device temperature (Temp). After $v_0, v_1,$ and $v_2, \ldots,$ are estimated at block 1306, the method 1300 determines if there is a temperature trigger at block 1308 or a time trigger at block 1310. In some examples, the temperature trigger of block 1308 may involve detecting the current temperature is greater than an estimated temperature ($Temp_{est}$) by $Temp_{Threshold}$. In some examples, the time trigger at block 1310 may involve detecting that the current time is greater than $T_{est}$ by $T_{Calibrationperiod}$. In the temperature trigger of block 1308 or the time trigger of block 1310 occurs, the method 1300 returns to block 1306 to estimate $v_0, v_1,$ and $v_2, \ldots,$ again. The method 1300 also includes an offset estimation being triggered at block 1312. The offset estimation trigger of block 1312 may be a device start-up, a time-base trigger, a schedule-based trigger, or a temperature drift trigger. At block 1314, offsets v(x) are estimated at target input voltage regions using the latest available values of $v_0, v_1,$ and $v_2, \ldots$. At block 1316, the offset estimated at block 1314 are returned. In some examples, the method 1300 may include generating an adjustment control signal responsive to the returned offset. The adjustment control signal may be provided to an adjustable comparator as described herein.

Figure 14:
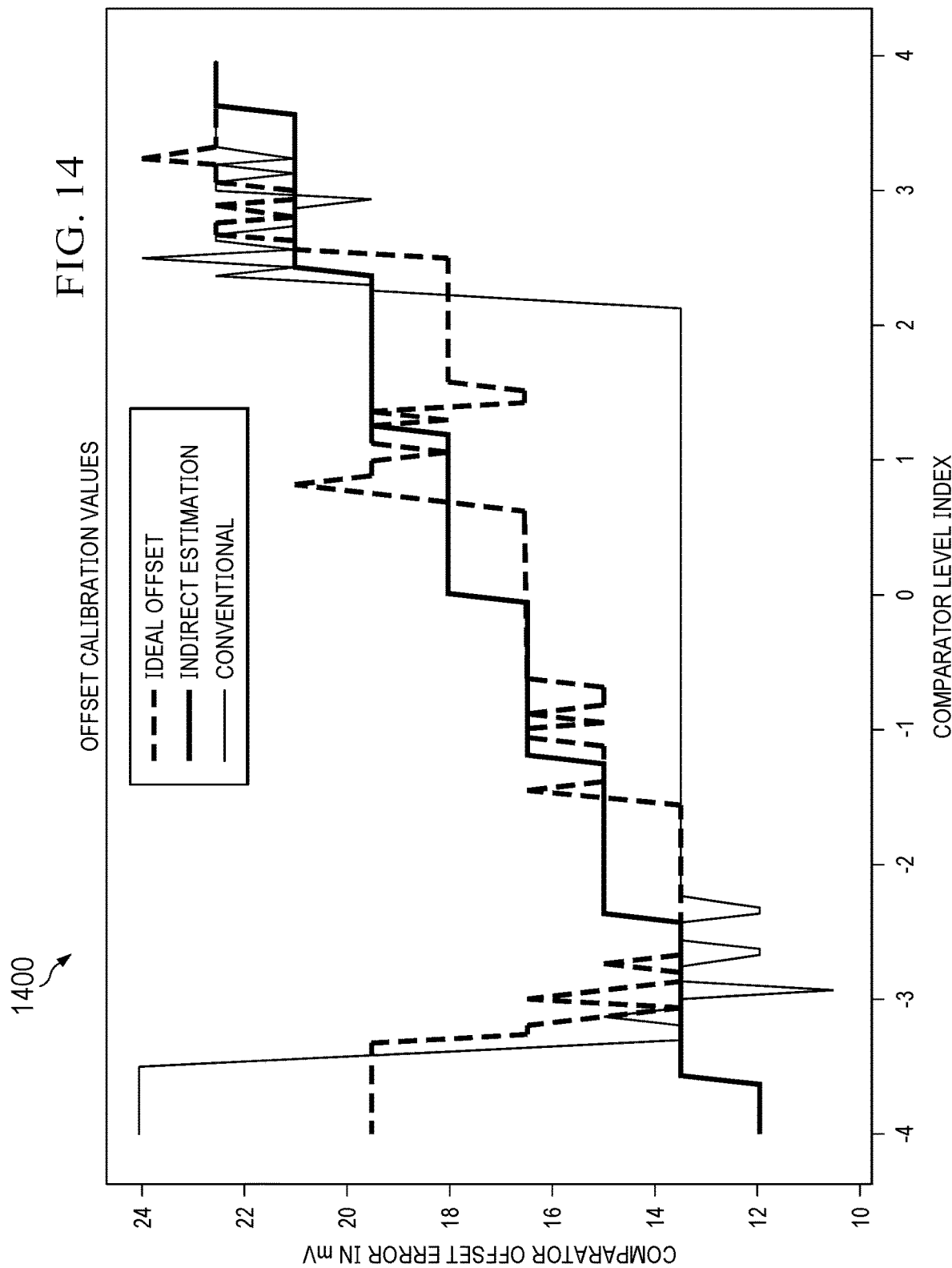
FIGS. 14 and 15 are graphs showing comparator offset error as a function of comparator level index.
Figure 15:
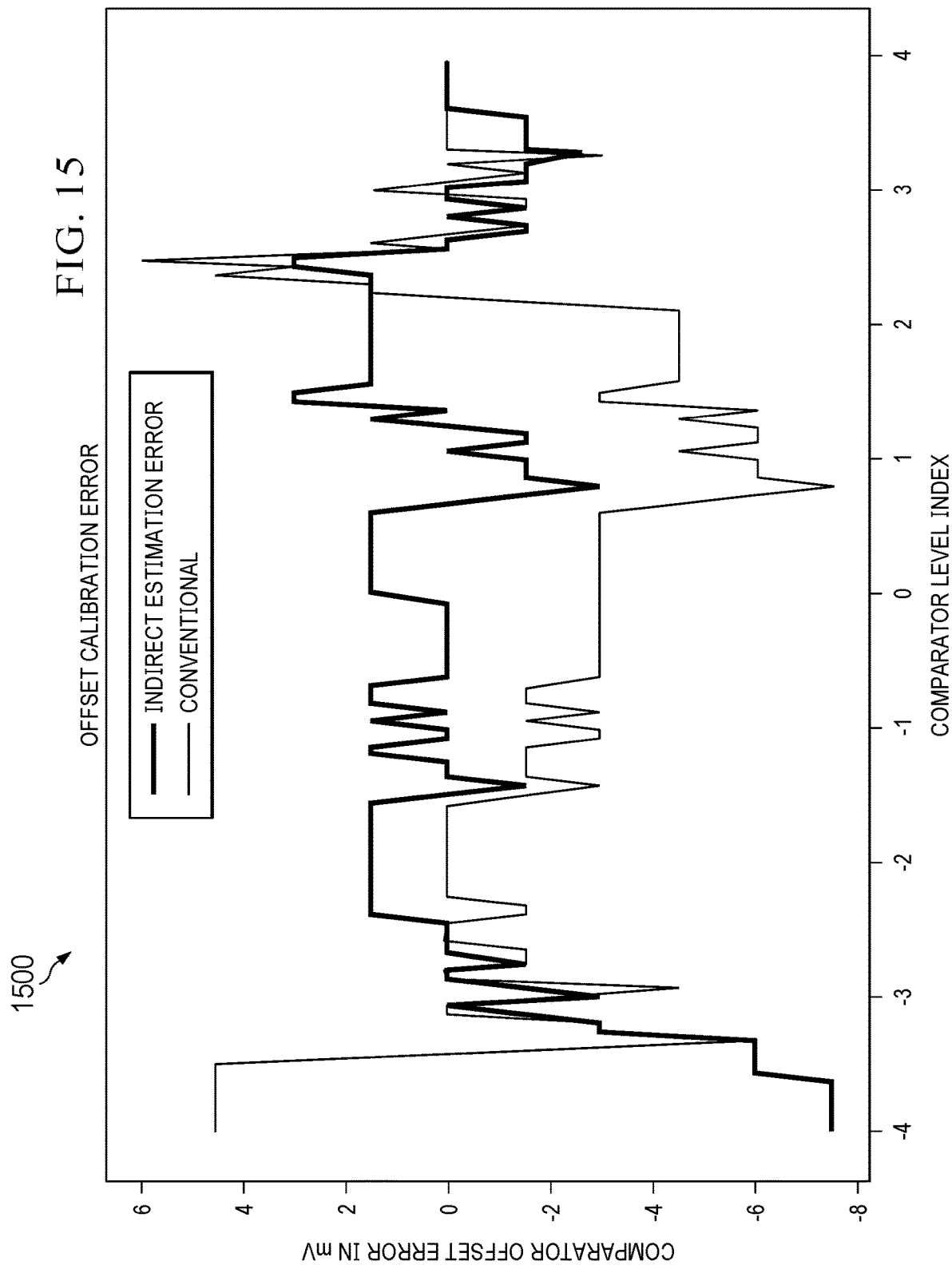

FIGS. 14 and 15 are graphs 1400 and 1500 showing comparator offset error as a function of comparator level index. In the graphs 1400 and 1500, an error offset comparator has 128 levels and is used for observing signal statistics at the input of slicer. The signal statistics are for statistically rich and statistically poor points. In graph 1400, the performance of comparator offset calibration of indirect offset estimation as described herein is compared with a different method and an ideal offset. The ideal offset is not measurable and is obtained by artificially resetting adaptation to avoid statistical deficient points. In graph 1500, the performance of comparator offset calibration of indirect offset estimation as described herein is compared with a conventional method. As shown in graph 1400, the indirect offset estimation provides a linear behavior offset across different levels. In some examples, comparator levels which are deficient in signal statistics are linearly interpolated using data from the −3 and +3) levels. As shown in graph 1500, indirect offset estimation improved calibration accuracy to +/−3 mV from +/−8 mV in the region of interest. Also, the calibration time of indirect offset estimation reduces the calibration time compared to the conventional technique from 100 ms to ~2 ms.

Figure 16:
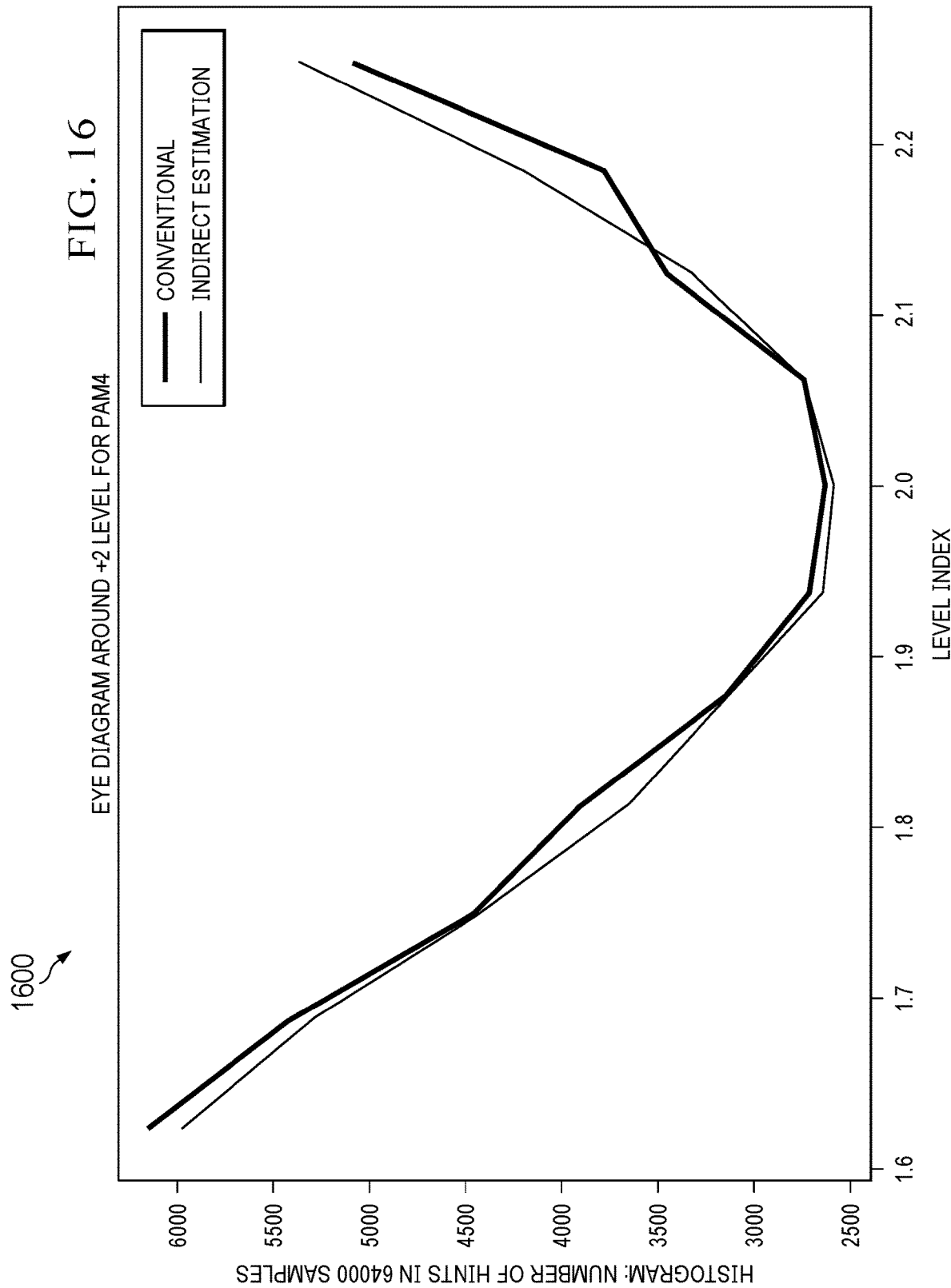
FIG. 16 is a graph showing example histogram results near the +2 level for PAM4.

FIG. 16 is a graph 1600 showing example histogram results near the +2 level for PAM4. In graph 1600, indirect offset estimation results in a more accurate calibration of an error comparator and an auxiliary error comparator compared to other calibration methods. With improved calibration of an error comparator and an auxiliary error comparator, the EYE diagram is improved. Such EYE diagrams may be used for BER extrapolation. In some examples, an error comparator and an auxiliary error comparator are calibrated for all levels (e.g., 128 levels). With the indirect estimation techniques, the offsets estimated during such calibration are estimated at data deficient points.

Figure 17:
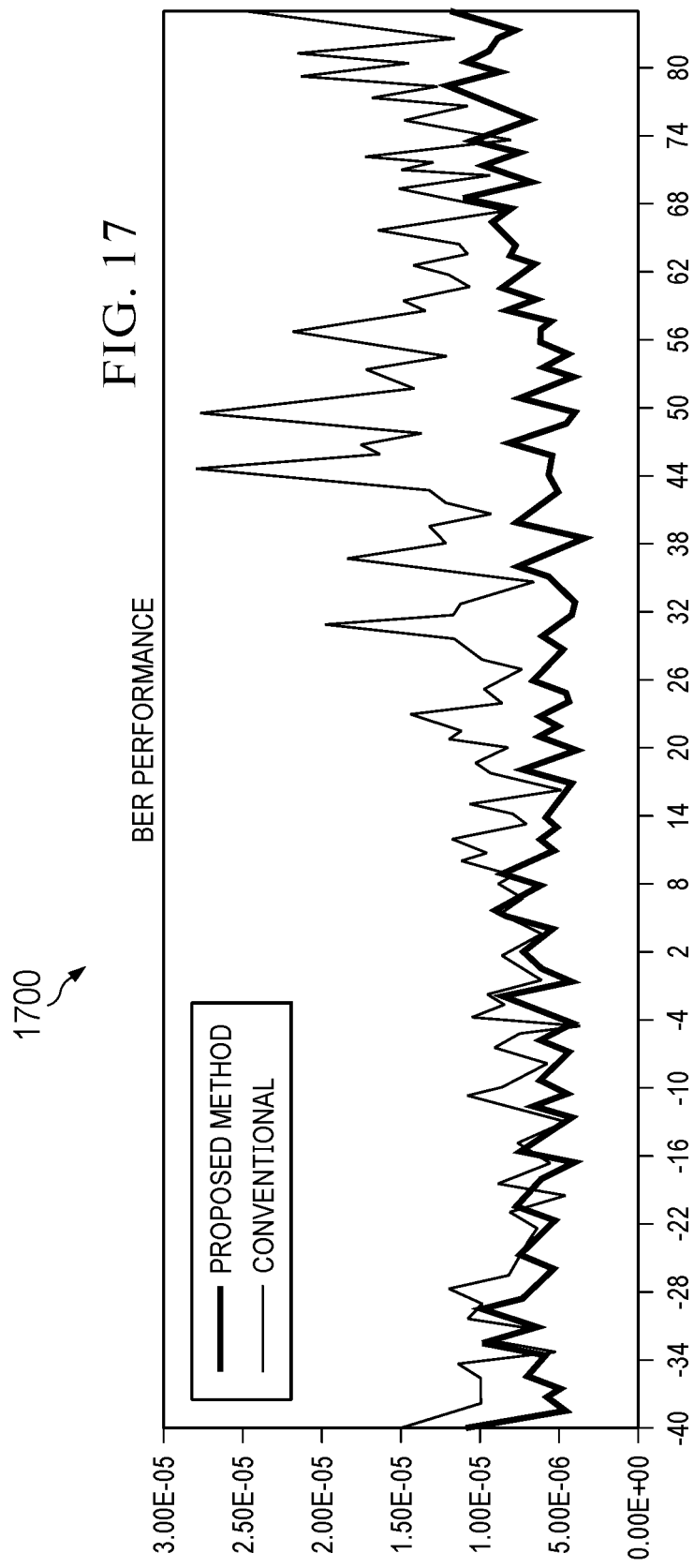
FIG. 17 is a graph showing example bit error rate (BER) results.

FIG. 17 is a graph 1700 showing example BER results. In graph 1700, BER resulting from indirect offset estimation is compared with BER from a conventional approach. The indirect offset estimation technique may be used for calibration of an error comparator, an auxiliary error comparator, and data slicer comparators as described herein. In some examples, the BER results of graph 1700 involves sweeping temperature from −40 to 85 degrees Celsius. A data Slicer offset is calibrated to track the offset change. The conventional method shows BER degradation at 50 degrees Celsius. With indirect offset estimation accurate estimation offsets around the data deficient +2/−2 levels results in BER improvement compared to the conventional approach.

Figure 18:
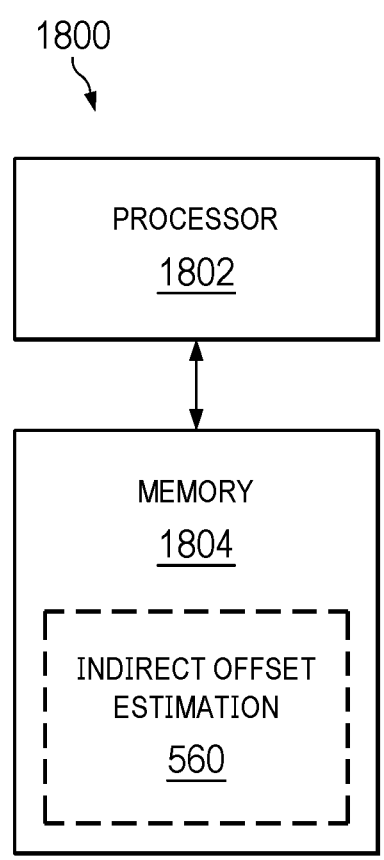
FIG. 18 is a block diagram showing an example controller.

FIG. 18 is a block diagram showing an example controller 1800. For example, the controller 1800 may be part of the calibrators 118A or 118B in FIG. 1, the calibrator 118C is FIG. 3, the controller 550 in FIG. 5, or the calibrator 118D in FIG. 9. As shown, the controller 1800 includes a processor 1802 coupled to memory 1804. The processor 1802 may be a single processor or multiple processors. The memory 1804 is a computer-readable medium (CRM) that stores indirect offset estimation instructions 560 executable by the processor 1802. When the indirection offset estimation instructions 560 are executed by the processor 1802, the processor performs some or all of the various operations described for the calibrators 118A or 118B in FIG. 1, the calibrator 118C is FIG. 3, the controller 550 in FIG. 5, or the calibrator 118D in FIG. 9. In some examples, the controller 1800 may include other circuitry such as analog-to-digital converters (ADCs), digital-to-analog converters (DACs), sense circuitry, and signal generation circuitry to provide the reference levels Y, record the offset levels Oy, provide the reference levels X, and use the resulting offset levels Ox to provide offset correction signals for comparators as described herein.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component and/or a conductor.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other examples, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated circuit. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described examples, and other examples are possible, within the scope of the claims.

What is claimed is:

1. A system comprising:
a first device; and
a second device coupled to the first device, the second device having a receiver, the receiver having a comparator and a controller, the comparator having an adjustment terminal, the controller having an input and an output, the output of the controller coupled to the adjustment terminal of the comparator, and the controller configured to:
obtain an offset estimation model;
receive an input voltage at its input;
determine a comparator offset responsive to the offset estimation model and the input voltage; and
provide an adjustment control signal to its output responsive to the comparator offset.

2. The system of claim 1, wherein the controller is configured to:
update a parameter of the offset estimation model; and
determine the comparator offset responsive to the offset estimation model, the updated parameter, and the input voltage.

3. The system of claim 2, wherein the controller is configured to update the parameter of the offset estimation model responsive to a schedule.

4. The system of claim 2, wherein the controller is configured to update the parameter of the offset estimation model responsive to a temperature drift.

5. The system of claim 2, wherein the controller is configured to:
obtain offset estimates from target input voltage regions; and
update the parameter of the offset estimation model responsive to the offset estimates.

6. The system of claim 2, wherein the parameter of the offset estimation model is a slope.

7. The system of claim 2, wherein the offset estimation model is a polynomial function of input voltage and the parameter includes polynomial coefficients of the polynomial function.

8. The system of claim 1, wherein the offset estimation model is based on offline modeling over a range of offsets.

9. The system of claim 1, wherein the receiver includes:
a continuous-time linear equalizer (CTLE) having an input and an output;
a feedforward equalizer (FFE) having an input and an output, the input of the FFE coupled to the output of the CTLE;
a combine circuit having a first input, a second input, and an output, the first input of the combine circuit coupled to the output of the FFE;
a data slicer having an input, a control terminal, and an output, the input of the data slicer coupled to the output of the combine circuit; and
a decision feedback equalizer (DFE) having an input and an output, the input of the DFE coupled to the output of the data slicer, and the output of the DFE coupled to the second input of the combine circuit, wherein the comparator is part of the data slicer.

10. The system of claim 9, wherein the CTLE, the FFE, the combine circuit, the data slicer, and the DFE are components of a retimer.

11. A receiver comprising:
a comparator having an adjustment terminal; and
a calibrator having an input and an output, the output coupled to the adjustment terminal, the calibrator configured to:

obtain an offset estimation model for the comparator;
receive an input voltage at its input;
determine a comparator offset responsive to the offset estimation model and the input voltage; and
provide an adjustment control signal at its output responsive to the comparator offset.

12. The receiver of claim 11, wherein the calibrator is configured to:
estimate a parameter of the offset estimation model; and
determine the comparator offset responsive to the offset estimation model, the estimated parameter, and the input voltage.

13. The receiver of claim 12, wherein the calibrator is configured to update the parameter of the offset estimation model responsive to a schedule.

14. The receiver of claim 12, wherein the calibrator is configured to update the parameter of the offset estimation model responsive to a temperature drift.

15. The receiver of claim 12, wherein the calibrator is configured to:
obtain offset estimates from target input voltage regions; and
update the parameter of the offset estimation model responsive to the offset estimates.

16. The receiver of claim 12, wherein the parameter of the offset estimation model is a slope.

17. The receiver of claim 11, wherein the offset estimation model is a polynomial function of input voltage.

18. The receiver of claim 11, wherein the offset estimation model is based on offline modeling over a range of offsets.

19. A method comprising:
obtaining an offset estimation model for a comparator;
receiving an input voltage;
determining a comparator offset responsive to the offset estimation model and the input voltage; and
providing the comparator offset to an adjustment terminal of the comparator.

20. The method of claim 19, further comprising:
estimating a parameter of the offset estimation model responsive to a schedule or temperature drift; and
determining the comparator offset responsive to the offset estimation model, the estimated parameter, and the input voltage.

* * * * *